United States Patent
Kim et al.

(10) Patent No.: US 9,991,292 B2
(45) Date of Patent: Jun. 5, 2018

(54) GATE DRIVER AND DISPLAY APPARATUS HAVING THE SAME

(71) Applicant: Samsung Display Co., Ltd., Gyeonggi-do (KR)

(72) Inventors: Jaewon Kim, Yongin (KR); Boyeong Kim, Yongin (KR); Soo-Hyun Kim, Yongin (KR); Kyung-ho Park, Yongin (KR); HyungJun Park, Yongin (KR); Dong-Hyun Yoo, Yongin (KR); Ki Yeup Lee, Yongin (KR); Seongyoung Lee, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 225 days.

(21) Appl. No.: 14/227,654

(22) Filed: Mar. 27, 2014

(65) Prior Publication Data
US 2014/0346520 A1    Nov. 27, 2014

(30) Foreign Application Priority Data

May 27, 2013    (KR) .................. 10-2013-0059803

(51) Int. Cl.
*H01L 27/12*     (2006.01)
*G09G 3/3266*    (2016.01)
*G09G 3/36*      (2006.01)

(52) U.S. Cl.
CPC ....... *H01L 27/1255* (2013.01); *G09G 3/3266* (2013.01); *G09G 3/3677* (2013.01); *G09G 2310/0267* (2013.01); *G09G 2310/0286* (2013.01); *G09G 2330/04* (2013.01); *G09G 2330/06* (2013.01)

(58) Field of Classification Search
CPC ............. H01L 27/1255; G09G 3/3266; G09G 3/3275; G09G 3/00; G09G 2310/267; G09G 2310/286; G09G 2330/04; G09G 2330/06; G09G 5/00; G11C 8/00
See application file for complete search history.

(56) References Cited

U.S. PATENT DOCUMENTS

| | | | |
|---|---|---|---|
| 8,138,792 B2 | 3/2012 | Chang et al. | |
| 2006/0203604 A1* | 9/2006 | Park ..................... | G09G 3/3648 365/185.23 |
| 2010/0225621 A1* | 9/2010 | Jung .................... | G09G 3/3677 345/204 |

(Continued)

FOREIGN PATENT DOCUMENTS

| | | |
|---|---|---|
| KR | 10-2000-0019488 A | 4/2000 |
| KR | 10-2006-0058507 A | 5/2006 |

(Continued)

*Primary Examiner* — Fernando L Toledo
*Assistant Examiner* — Lawrence-Linh T Nguyen
(74) *Attorney, Agent, or Firm* — Lee & Morse P.C.

(57) ABSTRACT

A driver includes a dummy stage and one or more additional stages coupled to the dummy stage. The dummy stage includes a first transistor coupled between an input terminal and an output terminal. The first transistor includes two electrodes forming at least a first capacitor to store at least a portion of static electricity received through the input terminal. The one or more additional stages output gate signals, which may be received, for example, by a display device.

12 Claims, 8 Drawing Sheets

(56) References Cited

U.S. PATENT DOCUMENTS

2010/0277206 A1\* 11/2010 Lee ...................... G09G 3/3677
                                                                       327/108
2012/0098800 A1    4/2012  Kim et al.
2012/0211772 A1    8/2012  Moh et al.
2013/0002312 A1    1/2013  Yamazaki et al.

FOREIGN PATENT DOCUMENTS

| KR | 10-2008-0100580 A | 11/2008 |
| KR | 10-2011-0002538 A | 1/2011 |
| KR | 10-2013-0011027 A | 1/2013 |

\* cited by examiner

GATE DRIVER AND DISPLAY APPARATUS HAVING THE SAME

CROSS-REFERENCE TO RELATED APPLICATION

Korean Patent Application No. 10-2013-0059803, filed on May 27, 2013, and entitled: "Gate Driver and Display Apparatus Having the Same," is incorporated by reference herein in its entirety.

BACKGROUND

1. Field

One or more embodiments herein relate to a gate driver for a display apparatus.

2. Description of the Related Art

In recent years, various display devices have been developed including a liquid crystal display device, an organic light emitting display device, an electro-wetting display device, a plasma display panel device, and an electrophoretic display device.

In general, these display devices include a display panel with pixels, a gate driver that applies gate signals to the pixels, and a data driver that applies data voltages to the pixels. The pixels receive the data voltages in response to the gate signals, and the pixels display gray-scale values corresponding to the data voltages in forming an image.

SUMMARY

Embodiments are directed to a gate driver, including a first signal line that receives a start signal, a dummy stage that receives the start signal through the first signal line and outputs the start signal, the dummy stage including a plurality of transistors, a plurality of interconnected stages that sequentially output a plurality of gate signals in response to control signals and the start signal, and a second signal line that applies the start signal output from the dummy stage to a first stage and a last stage of the plurality of interconnected stages, the first signal line being connected to the second signal line via the plurality of transistors.

The plurality of transistors may include a first transistor, a second transistor, and a third transistor having a size smaller than a size of each of the first transistor and the second transistor.

The first transistor may include a first gate electrode, a first insulating layer disposed on the first gate electrode, and a first drain electrode and a first source electrode, which are disposed on the first insulating layer to be spaced apart from each other and overlapped with the first gate electrode. First reduction capacitors may be formed between the first gate electrode and the first drain electrode and between the first gate electrode and the first source electrode.

The third transistor may include a third gate electrode disposed under and covered by the first insulating layer, and a third drain electrode and a third source electrode, which are disposed on the first insulating layer to be spaced apart from each other and overlapped with the third gate electrode. Second reduction capacitors may be formed between the third gate electrode and the third drain electrode and between the third gate electrode and the third source electrode. A total capacitance of the first reduction capacitors may be greater than a total capacitance of the second reduction capacitors.

The first signal line may be connected to the first gate electrode, the first gate electrode may extend to connect to the third gate electrode, and the third gate electrode may extend to connect to the second signal line.

The second transistor may include a second gate electrode disposed under and covered by the first insulating layer, and a second drain electrode and a second source electrode, which are disposed on the first insulating layer to be spaced apart from each other and overlapped with the second gate electrode. Third reduction capacitors may be formed between the second gate electrode and the second drain electrode and between the second gate electrode and the second source electrode. Each of a total capacitance of the first reduction capacitors and a total capacitance of the third reduction capacitors may be greater than a total capacitance of the second reduction capacitors.

The first signal line may be connected to the first gate electrode, the first gate electrode may extend to connect to the second gate electrode, the second gate electrode may extend to connect to the third gate electrode, and the third gate electrode may extend to connect to the second signal line.

Embodiments are also directed to a display apparatus, including a display panel that receives data voltages in response to gate signals and includes a plurality of pixels displaying gray-scales corresponding to the data voltages, a gate driver that applies the gate signals to the pixels, and a data driver that applies the data voltages to the pixels, the gate driver including a first signal line that receives a start signal, a dummy stage that receives the start signal through the first signal line and outputs the start signal, the dummy stage including a plurality of transistors, a plurality of interconnected stages that sequentially output a plurality of gate signals in response to control signals and the start signal, and a second signal line that applies the start signal output from the dummy stage to a first stage and a last stage of the stages, the first signal line being connected to the second signal line via the plurality of transistors.

The plurality of transistors may include a first transistor, a second transistor, and a third transistor having a size smaller than a size of each of the first transistor and the second transistor.

The first transistor may include a first gate electrode, a first insulating layer disposed on the first gate electrode, and a first drain electrode and a first source electrode, which are disposed on the first insulating layer to be spaced apart from each other and overlapped with the first gate electrode. First reduction capacitors may be formed between the first gate electrode and the first drain electrode and between the first gate electrode and the first source electrode.

The third transistor may include a third gate electrode disposed under and covered by the first insulating layer, and a third drain electrode and a third source electrode, which are disposed on the first insulating layer to be spaced apart from each other and overlapped with the third gate electrode. Second reduction capacitors may be formed between the third gate electrode and the third drain electrode and between the third gate electrode and the third source electrode. A total capacitance of the first reduction capacitors may be greater than a total capacitance of the second reduction capacitors.

The first signal line may be connected to the first gate electrode, the first gate electrode may extend to connect to the third gate electrode, and the third gate electrode may extend to connect to the second signal line.

The second transistor may include a second gate electrode disposed under and covered by the first insulating layer, and a second drain electrode and a second source electrode, which are disposed on the first insulating layer to be spaced apart from each other and overlapped with the second gate electrode. Third reduction capacitors may be formed between the second gate electrode and the second drain electrode and between the second gate electrode and the second source electrode. Each of a total capacitance of the first reduction capacitors and a total capacitance of the third reduction capacitors may be greater than a total capacitance of the second reduction capacitors.

The first signal line may be connected to the first gate electrode, the first gate electrode may extend to connect to the second gate electrode, the second gate electrode may extend to connect to the third gate electrode, and the third gate electrode may extend to connect to the second signal line.

Embodiments are also directed to a driver, including a dummy stage, and N stages coupled to the dummy stage. The dummy stage may include a first transistor coupled between an input terminal and an output terminal, the first transistor including two electrodes forming at least a first capacitor to store at least a portion of static electricity received through the input terminal, and wherein each of the N stages outputs a gate signal, where N≥1.

The two electrodes may be a gate electrode and a drain electrode.

The two electrodes may be a gate electrode and a source electrode.

The dummy stage may include a second transistor coupled to the first transistor. The second transistor may be coupled to the first transistor and may include two electrodes forming at least a second capacitor, the second capacitor to store a portion of the static electricity received through the input terminal.

The first and second capacitors may have different capacitances.

The first transistor may include a first number of capacitors formed between a gate electrode and a source or drain electrode, the second transistor may include a second number of capacitors formed between a gate electrode and a source or drain electrode, and the first number may be different from the second number.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. In the drawing figures, the dimensions of layers and regions may be exaggerated for clarity of illustration. Like reference numerals refer to like elements throughout.

Figure 1:
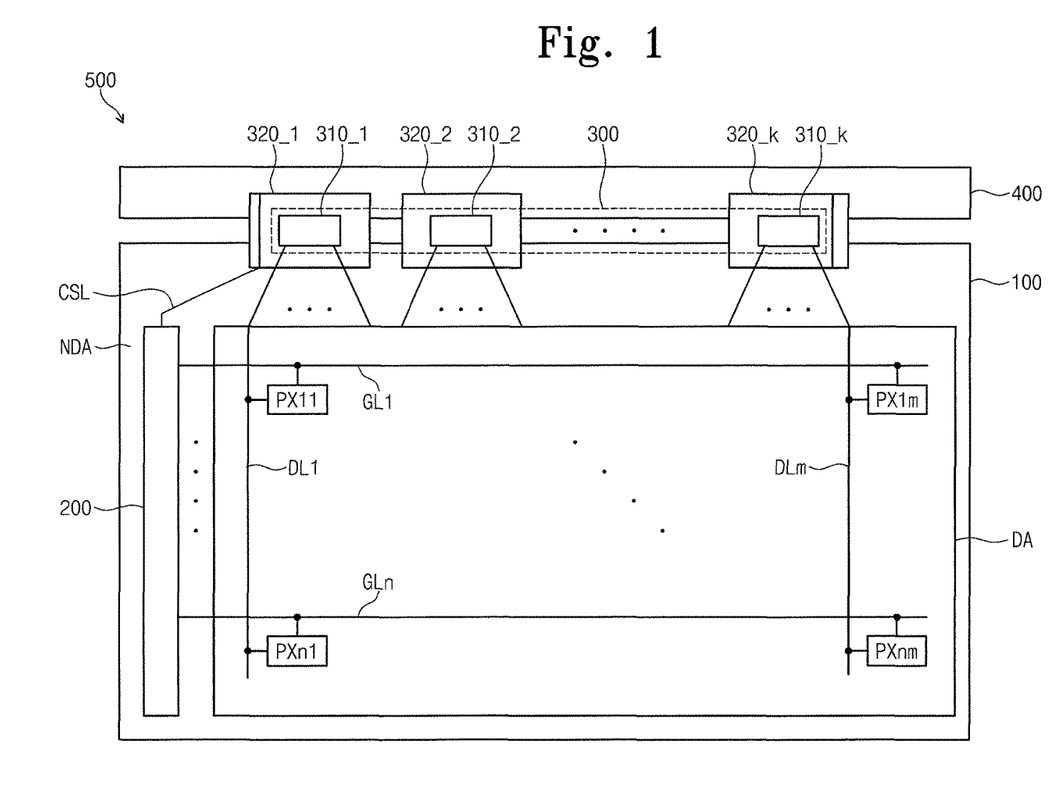
FIG. 1 illustrates an embodiment of a display apparatus.
Figure 2:
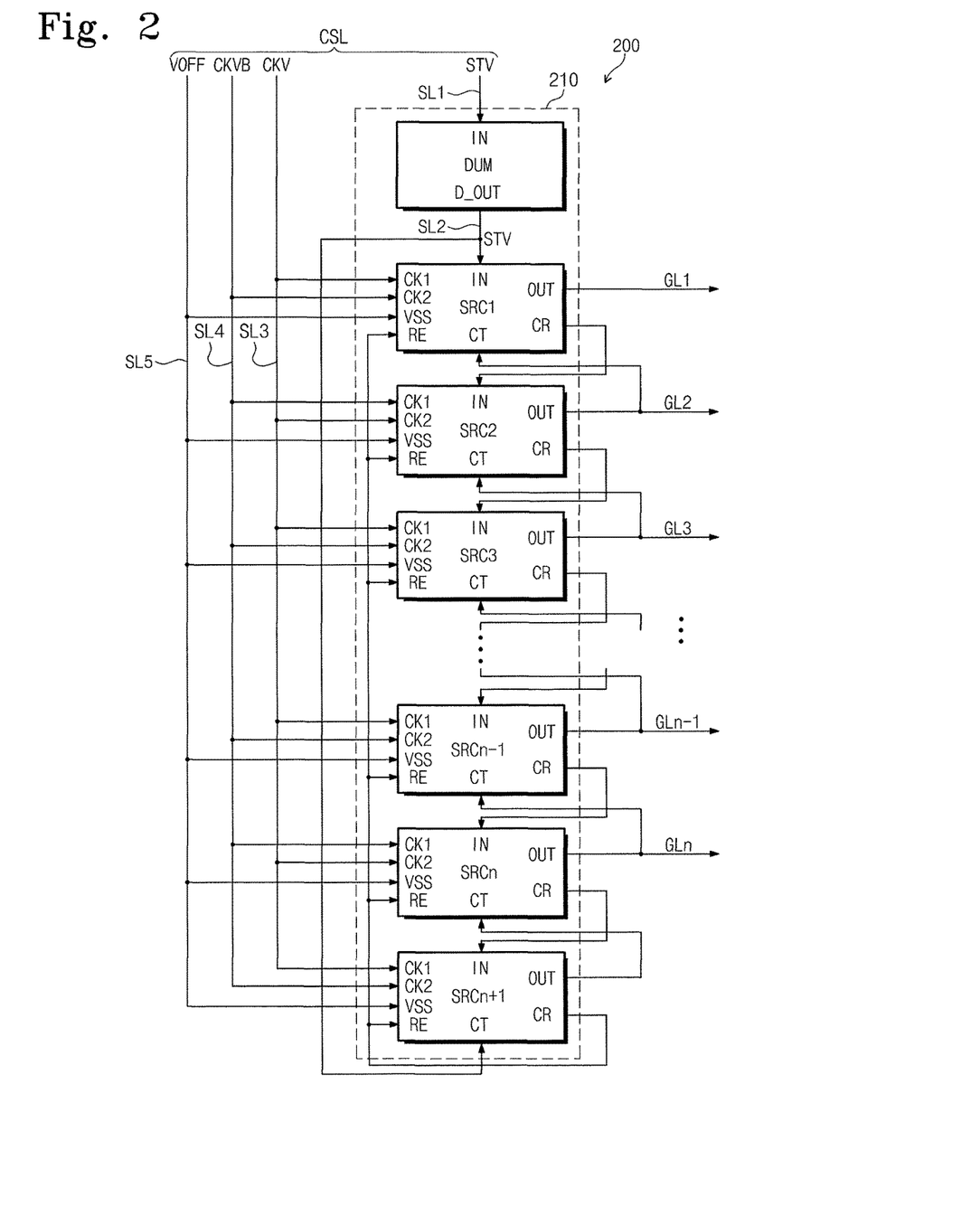
FIG. 2 illustrates an example of a gate driver in FIG. 1.

FIG. 1 illustrates an embodiment of a display apparatus, and FIG. 2 is a block diagram showing a gate driver shown in FIG. 1.

Referring to FIG. 1, a display apparatus 500 according to an embodiment includes a display panel 100, a gate driver 200, a data driver 300, and a driving circuit board 400.

The display panel 100 includes a display area DA in which a plurality of pixels PX11 to PXnm is arranged in a matrix configuration, a non-display area NDA surrounding the display area DA, a plurality of gate lines GL1 to GLn, a plurality of data lines DL1 to DLm crossing the gate lines GL1 to GLn, and a control signal line part CSL.

The gate lines GL1 to GLn are connected to the gate driver 200 to sequentially receive gate signals. The data lines DL1 to DLm are connected to the data driver 300 to receive data voltages in analog form.

The pixels PX11 to PXnm are arranged in areas defined by the gate lines GL1 to
GLn and the data lines DL1 to DLm. Thus, the pixels are arranged in "m" columns by "n" rows. Each of "m" and "n" is an integer number greater than 0.

Each of the pixels PX11 to PXnm is connected to a corresponding gate line of the gate lines GL1 to GLn and a corresponding data line of the data lines DL1 to DLm. Each of the pixels PX11 to PXnm receives the data voltage through the corresponding data line in response to the gate signal provided through the corresponding gate line. Thus, each of the pixels PX11 to PXnm displays a gray-scale corresponding to the data voltage, and thus a desired image is displayed.

The control signal line part CSL is connected to the gate driver 200 through a flexible circuit board 320_1 disposed at a leftmost position among flexible circuit boards 320_1 to 320_k. The control signal line part CSL receives control signals from a timing controller (not shown) mounted on the driving circuit board 400. The control signals are applied to the gate driver 200 through the control signal line part CSL.

The gate driver 200 is disposed in the non-display area NDA adjacent to one side of the display area DA. In one embodiment, the gate driver 200 may be mounted on the non-display area NDA adjacent to a left side of the display area DA in an amorphous silicon TFT gate driver circuit (ASG). In other embodiments, two non-display areas may be included on respective sides of the display area, to accommodate various driver or control circuits.

The gate driver 200 generates the gate signals in response to the control signals applied through the control signal line part CSL. The gate driver 200 sequentially applies the gate signals to the pixels PX11 to PXnm through the gate lines GL1 to GLn in the unit of row. Thus, the pixels PX11 to PXnm are driven in the unit of row.

The data driver 300 receives the data signals from the timing controller and generates the data voltages in analog form, which correspond to the data signals. The data driver 300 applies the data voltages to the pixels PX11 to PXnm through the data lines DL1 to DLm.

The data driver 300 includes a plurality of source driving chips 310_1 to 310_k. Here, "k" is an integer number greater than 0 and smaller than "m." Each of the source driving chips 310_1 to 310_k is mounted on a corresponding flexible circuit board of the flexible circuit boards 320_1 to 320_k and connected to the non-display area NDA adjacent to the driving circuit board 400 and an upper portion of the display area DA.

In one embodiment, the source driving chips 310_1 to 310_k are mounted on the flexible circuit boards 320_1 to 320_k by a tape carrier package (TCP) method. In other embodiments, the source driving chips 310_1 to 310_k may be mounted on the non-display area NDA adjacent to the upper portion of the display area DA by a chip on glass (COG) method.

Referring to FIG. 2, the gate driver 200 includes a shift register 210. The shift register 210 includes a dummy stage DUM and first to (n+1)th stages SRC1 to SRCn+1 connected one after another to each other. The first to n-th stages SRC1 to SRCn serve as a driving stage. The first to n-th stages SRC1 to SRCn are electrically connected to first to n-th gate lines GL1 to GLn, respectively, and sequentially output the gate signals.

The dummy stage DUM includes an input terminal IN and a dummy output terminal D_OUT. The dummy stage DUM receives a vertical start signal STV through an input terminal IN thereof. The vertical start signal STV is output through the dummy output terminal D_OUT. Thus, the vertical start signal STV is applied to an input terminal IN of the first stage SRC1 and a control terminal CT of a last stage, i.e., the (n+1)th stage SRCn+1, via the dummy stage DUM.

Each of the first to (n+1)th stages includes a first clock terminal CK1, a second clock terminal CK2, an off-voltage terminal VSS, a reset terminal RE, a control terminal CT, a carry terminal CR, an output terminal OUT, and an input terminal IN.

The first clock terminal CK1 receives a clock signal having a phase opposite to a clock signal applied to the second clock terminal CK2. For instance, the first clock terminals CK1 of odd-numbered stages SRC1, SRC3, . . . SRCn−1 receive a first clock signal CKV, and the second clock terminals CK2 of the odd-numbered stages SRC1, SRC3, SRCn−1 receive a second clock signal CKVB having the phase opposite to that of the first clock signal CKV. The first clock terminals CK1 of even-numbered stages SRC2, SRC4, . . . , SRCn receive the second clock signal CKVB, and the second clock terminals CK2 of the even-numbered stages SRC2, SRC4, . . . , SRCn receive the first clock signal CKV.

The input terminal IN of each of the second to (n+1)th stages SRC2 to SRCn+1 receives a carry signal output from the carry terminal CR of a previous stage. The carry signal output from the carry terminal CR drives a next stage.

The control terminal CT of each of the first to n-th stages SRC1 to SRCn receives the gate signal output from the output terminal OUT of the next stage. The off-voltage terminals VSS of the first to (n+1)th stages SRC1 to SRCn+1 receive an off-voltage VOFF (or a ground voltage). The reset terminals RE of the first to (n+1)th stages SRC1 to SRCn+1 commonly receive the carry signal output from the carry terminal CR of the (n+1)th stage SRCn+1.

In a case that the first and second clock signals CKV and CKVB are at a high level, the first and second clock signals CKV and CKV may serve as a gate-on voltage to drive the pixels. In a case that the first and second clock signals CKV and CKVB are at a low level, the first and second clock signals CKV and CKVB may serve as a gate-off voltage. The output terminals OUT of the first to (n+1)th stages SRC1 to SRCn+1 output the clock signal at the high level, which is applied to the first clock terminal CK1. For instance, the output terminals OUT of the odd-numbered stages SRC1, SRC3, . . . , SRCn-1 output the first clock signal CKV at the high level. The output terminals OUT of the even-numbered stages SRC2, SRC4, . . . , SRCn output the second clock signal CKVB at the low level. The carry terminals CR of the first to (n+1)th stages SRC1 to SRCn+1 output the carry signal based on the same clock signal as the clock signal output from the output terminal OUT.

The control signal line part CSL includes a first control line SL1 receiving the vertical start signal STV, a second control line SL2 receiving the vertical start signal STV output from the dummy stage DUM, a third control line SL3 receiving the first clock signal CKV, a fourth control line SL4 receiving the second clock signal CKVB, and a fifth control line SL5 receiving the off-voltage VOFF.

The first control line SL1 is connected to the input terminal IN of the dummy stage DUM to apply the vertical start signal STV to the dummy stage DUM. Static electricity may enter to the first control line SL1 from an external source. The dummy stage DUM may disperse the static electricity, which enters from the external source through the first control line SL1, to reduce the static electricity.

The second control line SL2 is connected to the dummy output terminal D_OUT of the dummy stage DUM, the input terminal IN of the first stage SRC1, and the control terminal CT of the (n+1)th stage SRCn+1. The second control line SL2 applies the vertical start signal STV output from the dummy output terminal D_OUT of the dummy stage DUM to the input terminal IN of the first stage SRC1 and the control terminal CT of the (n+1)th stage SRCn+1.

The third control line SL3 is connected to the first clock terminals CK1 of the odd-numbered stages SRC1, SRC3, . . . , SRCn−1 and the second clock terminals CK2 of the even-numbered stages SRC2, SRC4, . . . , SRCn. Thus, the third control line SL3 applies the first clock signal CKV to the first to (n+1)th stages SRC1 to SRCn+1.

The fourth control line SL4 is electrically connected to the first clock terminals CK1 of the even-numbered stages SRC2, SRC4, . . . , SRCn and the second clock terminals CK2 of the odd-numbered stages SRC1, SRC3, . . . SRCn−1. Thus, the fourth control line applies the second clock signals to the first to (n+1)th stages SRC1 to SRCn+1.

The fifth control line SL5 is electrically connected to the off-voltage terminals VSS of the first to (n+1)th stages SRC1 to SRCn+1. Thus, the fifth control line SL5 applies the off-voltage VSS to the first to (n+1)th stages SRC1 to SRCn+1.

In the absence of the dummy stage DUM, the first control line SL1 is connected to the fifth control line SL5. Thus, the static electricity from the external source may be directly applied to the first to (n+1)th stages SRC1 to SRCn+1 through the first and fifth control lines SL1 and SL5. Thus, the first stage SRC1 and the (n+1)th stage SRCn+1 may be damaged by the static electricity. The stages are sequentially operated after the first stage SRC1 is driven. Thus, the stages may not be driven when the first stage SRC1 is damaged.

In accordance with one embodiment, the dummy stage DUM in the gate driver 200 may disperse static electricity entering from an external source to reduce the effect of static electricity on the gate driver. Thus, static electricity entering from an external source may be reduced by the dummy stage DUM. Even though the static electricity enters into the gate driver 200, the dummy stage DUM may reduce the static electricity, and thus the first stage SRC1 and the (n+1)th stage SRCn+1 may be prevented from being damaged. Consequently, the gate driver 200 and the display apparatus 500 having the gate driver 200 may have improved resistance to static electricity. A detailed structure of one embodiment of the dummy stage DUM will be described in greater detail below.

Figure 3:
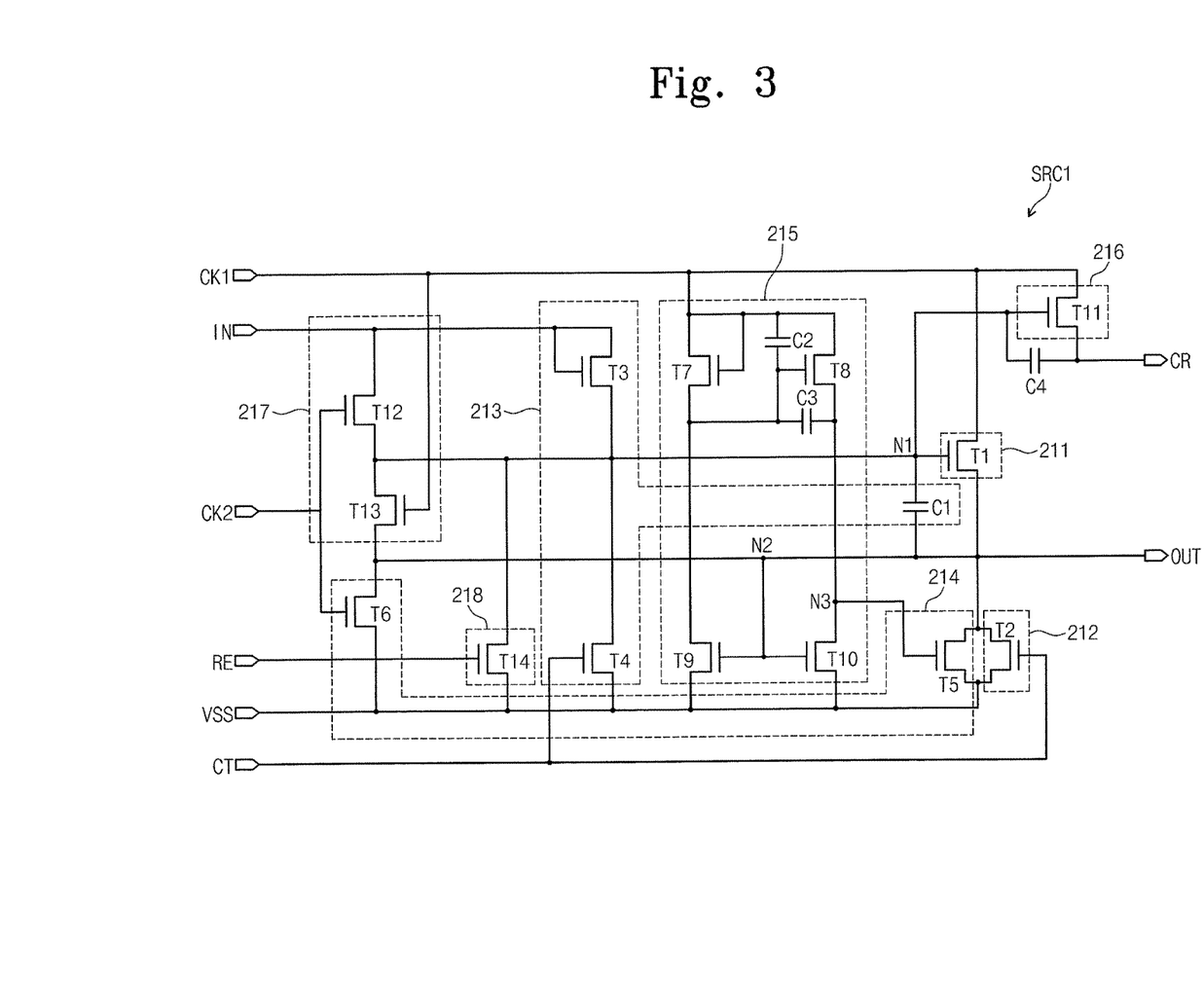
FIG. 3 illustrates a first stage in FIG. 2.

FIG. 3 illustrates an example of a first stage SRC1 in FIG. 2.

The first stage may have the same or similar structure and function as second to (n+1)th stages SRC2 to SRCn+1. Referring to FIG. 3, the first stage SRC1 includes a pull-up part 211, a pull-down part 212, a driver part 213, a holding part 214, a switching part 215, and a carry part 216. Hereinafter, the gate signals output from the first to (n+1) stages SRC1 to SRCn+1 will be referred to as first to (n+1)th gate signals.

The pull-up part 211 pulls up the first clock signal CKV provided through the first clock terminal CK1 to output the pulled-up first clock signal as a first gate signal through the output terminal OUT. The pull-up part 211 includes a first transistor T1 having a gate electrode connected to a first node N1, a drain electrode connected to the first clock terminal CK1, and a source electrode connected to the output terminal OUT.

The control terminal CT receives a second gate signal output through the output terminal OUT of the second stage SRC2. The pull-down part 212 pulls down the pulled-up first gate signal to the off-voltage VOFF provided through the off-voltage terminal VSS. The pull-down part 212 includes a second transistor T2 having a gate electrode connected to the control terminal CT, a drain electrode connected to the output terminal OUT, and a source electrode connected to the off-voltage terminal VSS.

The driver part 213 receives the vertical start signal STV output from the dummy output terminal D_OUT of the dummy stage DUM through the input terminal IN. The driver part 213 turns on the pull-up part 211 in response to the vertical start signal STV provided from the dummy stage DUM and turns off the pull-up part 211 in response to the second gate signal.

The driver part 213 includes a third transistor T3, a fourth transistor T4, and a capacitor C1. The third transistor T3 includes a gate electrode and a drain electrode, which are commonly connected to the input terminal IN, and a source electrode connected to the first node N1. The capacitor C1 includes a first electrode connected to the first node N1 and a second electrode connected to a second node N2. The fourth transistor T4 includes a gate electrode connected to the control terminal CT, a drain electrode connected to the first node N1, and a source electrode connected to the off-voltage terminal VSS.

The third transistor T3 receives the vertical start signal STV output from the dummy output terminal D_OUT of the dummy stage DUM through the input terminal IN. The third transistor T3 is turned on in response to the vertical start signal STV, and the first capacitor C1 is charged with the vertical start signal STV. When the first capacitor C1 is charged with electric charges equal to or greater than a threshold voltage of the first transistor T1, the first transistor T1 is turned on. The turned-on first transistor T1 outputs the first clock signal CKV, which is provided through the first clock terminal CK1, to the output terminal OUT.

Due to coupling of the first capacitor C1 caused by a sudden change of electric potential of the second node N2, an electric potential of the first node N1 is bootstrapped by the change in amount of the electric potential of the second node N2. Therefore, the first transistor T1 may output the first clock signal CKV, which is received through the drain electrode thereof, to the output terminal OUT.

The first clock signal CKV output through the output terminal OUT is the first gate signal applied to the first gate line GL1. The vertical start signal STV is used to pre-charge the first transistor T1, to thereby generate the first gate signal. Then, the fourth transistor T4 is turned on in response to the second gate signal. When the fourth transistor T4 is turned on, the electric charges charged in the first capacitor C1 are discharged to the level of the off-voltage VOFF applied through the off-voltage terminal VSS.

The holding part 214 includes a fifth transistor T5 and a sixth transistor T6 to hold the first gate signal at the off-voltage level. The fifth transistor T5 includes a gate electrode connected to a third node N3, a drain electrode connected to the second node N2, and a source electrode connected to the off-voltage terminal VSS. The sixth transistor T6 includes a gate electrode connected to the second clock terminal CK2, the drain electrode connected to the second node N2, and a source electrode connected to the off-voltage terminal VSS.

The switching part 215 includes a seventh transistor T7, an eighth transistor T8, a ninth transistor T9, a tenth transistor T10, a second capacitor C2, and a third capacitor C3 and controls a drive of the holding part 214. The seventh transistor T7 includes a gate electrode and a drain electrode, which are connected to the first clock terminal CK1, and a source electrode connected to the third node N3 through the third capacitor C3. The eighth transistor T8 includes a drain electrode connected to the first clock terminal CK1, a gate electrode connected to the drain electrode thereof through the second capacitor C2, and a source electrode connected to the third node N3. In addition, the source electrode of the eighth transistor T8 is connected to the gate electrode thereof through the third capacitor C3.

The ninth transistor T9 includes a drain electrode connected to the source electrode of the seventh transistor T7, a gate electrode connected to the second node N2, and a source electrode connected to the off-voltage terminal VSS. The tenth transistor T10 includes a drain electrode connected to the third node N3, a gate electrode connected to the second node N2, and a source electrode connected to the off-voltage terminal VSS.

When the clock signal at the high level is output through the output terminal OUT as the first gate signal, the electric potential of the second node N2 increases to the high level. When the electric potential of the second node N2 increases to the high level, the ninth transistor T9 and the tenth transistor T10 are turned on. Then, the seventh transistor T7 and the eighth transistor T8 are turned on in response to the first clock signal CKV applied to the first clock terminal CK1, and the signals output through the seventh and eighth transistors T7 and T8 are discharged to the off-voltage VOFF through the ninth and tenth transistors T9 and T10. Thus, an electric potential of the third node N3 is maintained at the low level while the gate signal is output at the high level. As a result, the fifth transistor T5 is maintained at a turn-off state.

Then, the first gate signal is discharged through the off-voltage terminal VSS in response to the second gate signal of the second stage SRC2, which is provided through the control terminal CT, and the electric potential of the second node N2 decreases to a low level. Therefore, the ninth and tenth transistors T9 and T10 are turned off, and the electric potential of the third node N3 increases to the high level in response to the signals output through the seventh and eighth transistors T7 and T8. As described above, the electric potential of the third node N3 increases. Thus, the fifth transistor T5 is turned on and the electric potential of the second node N2 is discharged to the off-voltage VOFF through the fifth transistor T5.

Under the above stated circumstances, when the sixth transistor T6 is turned on in response to the second clock signal CKVB applied to the second clock terminal CK2, the electric potential of the second node N2 is increasingly discharged through the off-voltage terminal VSS. As a result, the fifth transistor T5 and the sixth transistor T6 of the holding part 214 hold the electric potential of the second node N2 at the off-voltage VOFF. The switching part 215 determines a turn-on timing of the fifth transistor T5.

The carry part 216 includes an eleventh transistor T11 having a drain electrode connected to the first clock terminal CK1, a gate electrode connected to the first node N1, and a source electrode connected to the carry terminal CR. The eleventh transistor T11 is turned on when the electric potential of the first node N1 increases, and outputs the first clock signal CKV provided through the drain electrode thereof to the carry terminal CR.

The first stage SRC1 further includes a ripple preventing part 217 and a reset part 218. The ripple preventing part 217 prevents the first gate signal maintained at the level of the off-voltage VOFF from being rippled by a noise input through the input terminal IN. To this end, the ripple preventing part 217 includes a twelfth transistor T12 and a thirteenth transistor T13. The twelfth transistor T12 includes a drain electrode connected to the input terminal IN, a gate electrode connected to the second clock terminal CK2, and a source electrode connected to the first node N1. The thirteenth transistor T13 includes a drain electrode connected to the first node N1, a gate electrode connected to the first clock terminal CK1, and a source electrode connected to the second node N2.

The reset part 218 includes a fourteenth transistor T14 having a drain electrode connected to the first node N1, a gate electrode connected to the reset terminal RE, and a source electrode connected to the off-voltage terminal VSS. The fourteenth transistor T14 discharges the electric potential of the first node N1 to the off-voltage VOFF in response to an (n+1)th gate signal of the (n+1)th stage SRCn+1 input though the reset terminal RE.

The output of the (n+1)th gate signal corresponds to an end of one frame. Thus, the reset part 218 discharges the first node N1 of the stages SRC1 to SRCn+1 at the end of the one frame. Thus, the fourteenth transistor T14 of each reset part 218 of the stages SRC1 to SRCn+1 resets the first node N1 of each of the stages SRC1 to SRCn+1 to the off-voltage VOFF. As a result, the stages SRC1 to SRCn+1 of the shift register 210 may start its operation after being initialized.

Figure 4:
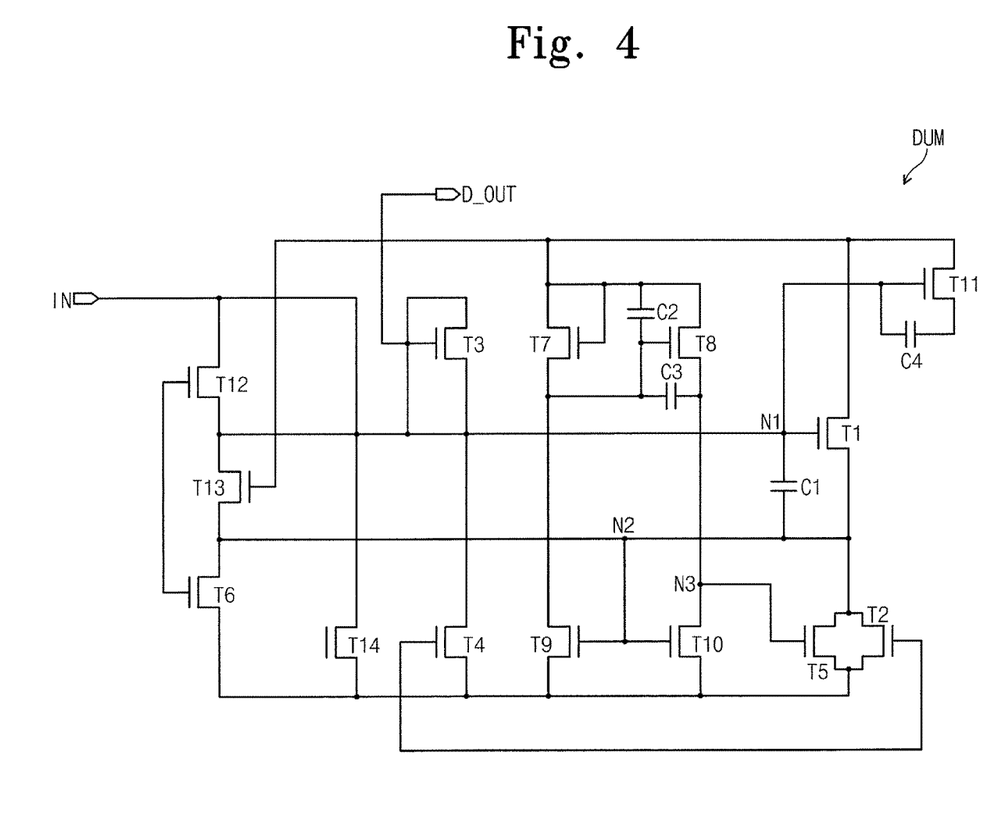
FIG. 4 illustrates a dummy stage in FIG. 2.

FIG. 4 illustrates an example of the dummy stage shown in FIG. 2.

The dummy stage DUM may have substantially the same structure and function as those of the first stage SRC1 shown in FIG. 3, except for the connection structure of the first and third transistors T1 and T3. Thus, in order to avoid repetition, only the structure and function of the dummy stage DUM that are different from those of the first stage SRC1 will be described in detail.

Referring to FIG. 4, the dummy stage DUM does not receive the first clock signal CKV, the second clock signal CKVB, and the off-voltage VOFF and does not generate the gate signal. Thus, the dummy stage DUM does not need to include the first clock terminal CK1, the second clock terminal CK2, the off-voltage terminal VSS, the reset terminal RE, the control terminal CT, the carry terminal CR, and the output terminal OUT.

The gate electrode of the first transistor T1 is connected to the input terminal IN. The input terminal IN is connected to the first control line SL1 to receive the vertical start signal STV.

The gate electrode of the first transistor T1 is connected to the gate electrode of the third transistor T3. The gate electrode of the third transistor T3 is connected to the dummy output terminal D_OUT. The dummy output terminal D_OUT is connected to the second control line SL2. Thus, the first control line SL1 is electrically connected to the second control line SL2 via the first and third transistors T1 and T3.

The vertical start signal STV provided through the first control line SL1 is applied to the gate electrode of the first transistor T1 and the gate electrode of the third transistor T3 via the input terminal IN. The vertical start signal STV is output through the dummy output terminal D_OUT via the gate electrodes of the first and third transistors T1 and T3.

Static electricity may be applied to the first control line SL1 from an external source. The static electricity entering through the first control line SL1 may be dispersed by reduction capacitors included in the first and third transistors T1 and T3. Thus, the static electricity entering through the first control line SL1 may be reduced by the first and third transistors T1 and T3.

The reduction capacitors included in the first and third transistors T1 and T3 may be capacitors formed between the gate electrode and the source electrode and between the gate electrode and the drain electrode of the first and third transistors T1 and T3. The configurations of the first and third transistors T1 and T3 will be described in detail with reference to FIGS. 5 and 6.

Figure 5:
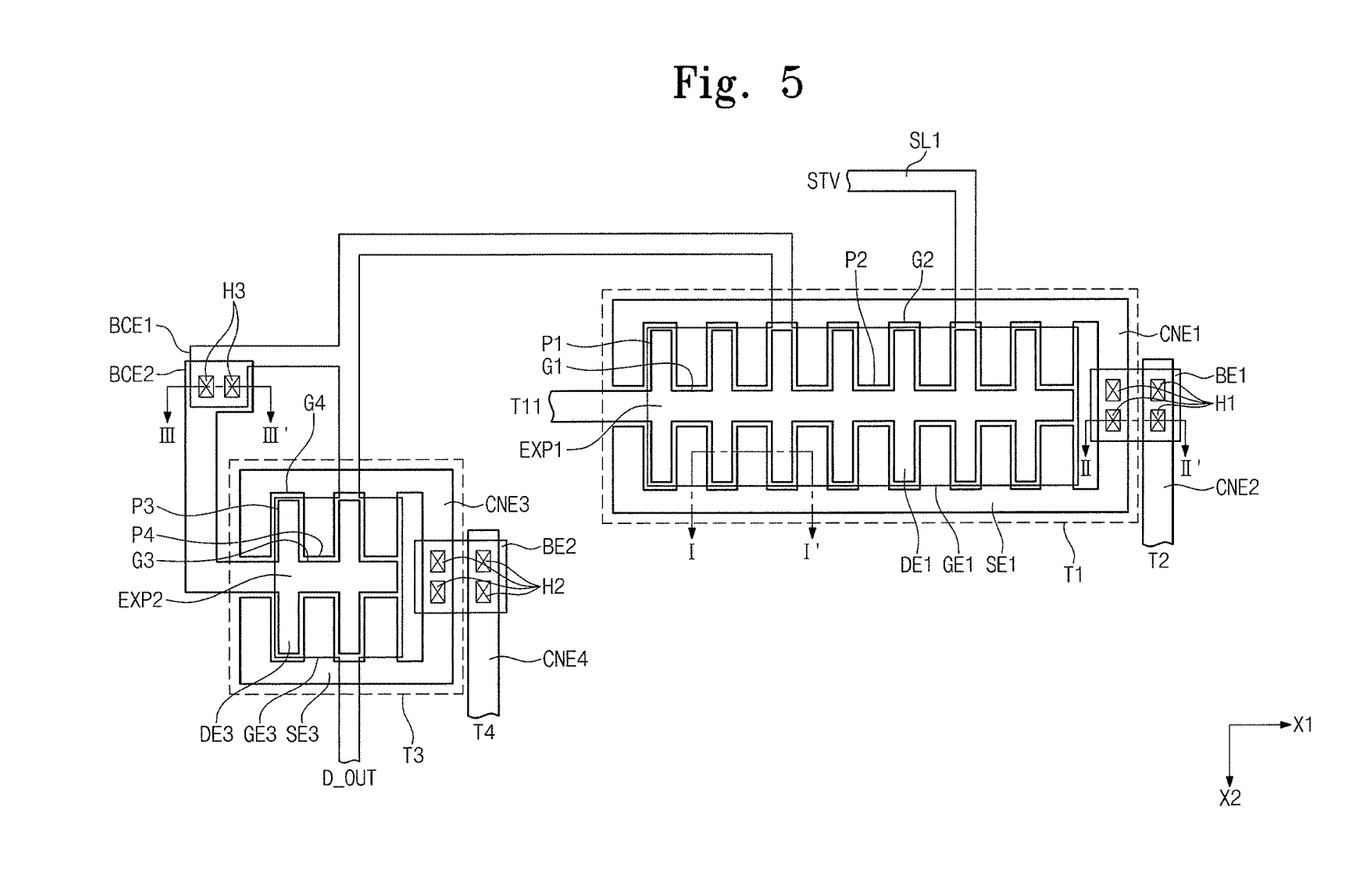
FIG. 5 illustrates first and third transistors in FIG. 4.
Figure 6:
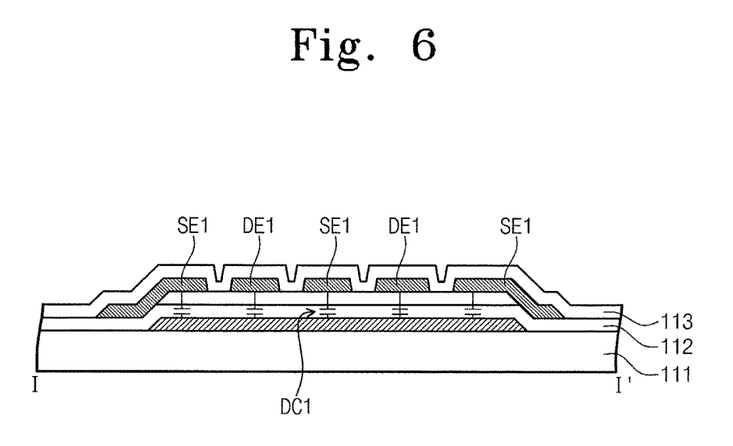
FIG. 6 illustrates a cross-sectional view along a line I-I' in FIG. 5.
Figure 7:
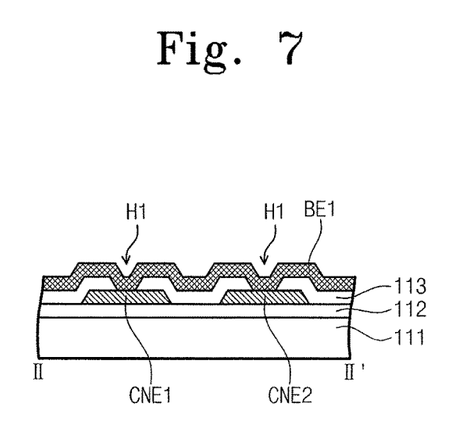
FIG. 7 illustrates a cross-sectional view along a line II-II' in FIG. 5.
Figure 8:
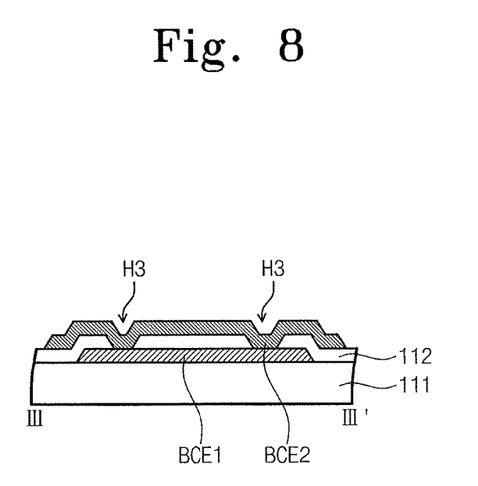
FIG. 8 illustrates a cross-sectional view along a line shown in FIG. 5.

FIG. 5 illustrates an embodiment of the first and third transistors in FIG. 4, FIG. 6 is a cross-sectional view along a line I-I' in FIG. 5, FIG. 7 is a cross-sectional view along a line II-II' in FIG. 5, and FIG. 8 is a cross-sectional view along a line III-III' in FIG. 5.

Hereinafter, the gate electrode, the drain electrode, and the source electrode of the first transistor T1 will be referred to as a first gate electrode GE1, a first drain electrode DE1, and a first source electrode SE1, respectively. In addition, the gate electrode, the drain electrode, and the source electrode of the third transistor T3 will be referred to as a third gate electrode GE3, a third drain electrode DE3, and a third source electrode SE3, respectively.

Referring to FIG. 5, the first control line SL1 is connected to the first gate electrode GE1 of the first transistor T1. The first gate electrode GE1 is extended to be connected to the third gate electrode GE3 of the third transistor T3. The first control line SL1 and the first gate electrode GE1 are formed on the same layer.

The first drain electrode DE1 of the first transistor T1 includes a first extension portion EXP1 extended in a first direction X1, a plurality of first protrusion portions P1 extended in a second direction X2 substantially perpendicular to the first direction X1 and extended in an opposite direction to the second direction X2, and first grooves G1 disposed between the first protrusion portions P1. The first drain electrode DE1 may be extended to be connected to the drain electrode of the eleventh transistor T11.

The first source electrode SE1 of the first transistor T1 includes second protrusion portions P2, which extend in the second direction X2 and extend in the opposite direction to the second direction X2 to face each other, and second grooves G2 disposed between the second protrusion portions P2. The second protrusion portions P2 disposed at a rightmost position are connected to each other to form a first connection electrode CNE1.

The first protrusion portions P1 are alternately arranged with the second protrusion portions P2. Thus, the first protrusion portions P1 are disposed adjacent to the second grooves G2, and the second protrusion portions P2 are disposed adjacent to the first grooves G1.

When viewed in a plan view, the first gate electrode GE1 of the first transistor T1 is overlapped with the first protrusion portions P1, the first extension portion EXP1, and the second protrusion portions P2 except for the second protrusion portion P2 disposed at the rightmost position.

As shown in FIG. 6, the display panel 100 includes a first base substrate 111, a first insulating layer 112, and a second insulating layer 113. The first gate electrode GE1 is disposed on the first base substrate 111. The first control line SL1 is formed on the same layer as the first gate electrode GE1. Thus, the first control line SL1 is formed on the first base substrate 111.

The first insulating layer 112 is disposed on the first base substrate 111 to cover the first gate electrode GE1. The first insulating layer 112 may be a gate insulating layer. A first semiconductor layer SM1 of the first transistor T1 is disposed on the first insulating layer 112 which covers the first gate electrode GE1. The first semiconductor layer SM1 may include an active layer and an ohmic contact layer.

The first source electrode SE1 and the first drain electrode DE1 are disposed on the first semiconductor layer SM1 and the first insulating layer 112 to be spaced apart from each other. The second insulating layer 113 is disposed on the first insulating layer 112 and the first semiconductor layer SM1 to cover the first source electrode SE1 and the first drain electrode DE1.

First reduction capacitors DC1 are formed between the first gate electrode GE1 and the first drain electrode DE1 and between the first gate electrode GE1 and the first source electrode SE1.

The first connection electrode CNE1 and a second connection electrode CNE2 are electrically connected to a first bridge electrode BE1 through first contact holes H1. Particularly, as shown in FIG. 7, the first insulating layer 112 is disposed on the first base substrate 111, and the first connection electrode CNE1 and the second connection electrode CNE2 are disposed on the first insulating layer 112 to be spaced apart from each other.

The second insulating layer 113 is disposed on the first insulating layer 112 to cover the first connection electrode CNE1 and the second connection electrode CNE2. The first contact holes H1 are formed penetrating through the second insulating layer 112 to expose a portion of the first connection electrode CNE1 and a portion of the second connection electrode CNE2, respectively. The first bridge electrode BE1 electrically connects the first connection electrode CNE1 to the second connection electrode CNE2 through the first contact holes H1. The second connection electrode CNE2 may be extended to be connected to the drain electrode of the second transistor T2.

The first control line SL1 is connected to the first gate electrode GE1 of the first transistor T1, and the first gate electrode GE1 is extended to be connected to the third gate electrode GE3 of the third transistor T3. The third gate electrode GE3 is extended to be connected to the dummy output terminal D_OUT, and the dummy output terminal D_OUT is connected to the second control line SL2. Thus, the first control line SL1 is electrically connected to the second control line SL2 via the first and third transistors T1 and T3.

The third drain electrode DE3 of the third transistor T3 includes a second extension portion EXP2 extended in the first direction X1, a plurality of third protrusion portions P3 extended from the second extension portion EXP2 in the second direction X2 and in the opposite direction to the second direction X2, and third grooves G3 disposed between the third protrusion portions P3.

The third source electrode SE3 of the third transistor T3 includes fourth protrusion portions P4 extended in the second direction X2 and extended in the opposite direction to the second direction X2 to face each other and fourth grooves G4 disposed between the fourth protrusion portions P4. The fourth protrusion portions disposed at the rightmost position are connected to each other to foi1 n a third connection electrode CNE3.

When viewed in a plan view, the third gate electrode GE3 of the third transistor T3 is overlapped with the third protrusion portions P3, the second extension portion EXP2, and the fourth protrusion portions P4 except for the fourth protrusion portion P4 disposed at the leftmost side.

The cross-sectional structure of the third transistor T3 is substantially the same as that of the first transistor T1. Thus, although not shown in figures, second reduction capacitors are formed between the third gate electrode GE3 and the third drain electrode DE3 and between the third gate electrode GE3 and the third source electrode SE3.

As shown in FIG. 5, a size of the first transistor T1 is greater than that of the third transistor T3 when viewed in a plan view. Thus, the number of the first and second protrusion portions P1 and P2 of the first transistor T1 is greater than the number of the third and fourth protrusion portions P3 and P4 of the third transistor T3. In addition, when viewed in a plan view, a size of the first gate electrode GE1 of the first transistor T1 is greater than that of the third gate electrode GE3 of the third transistor T3. Therefore, the number of the first reduction capacitors DC1 formed in the first transistors T1 may be greater than the number of the second reduction capacitors formed in the third transistor T3.

In general, a capacitance of a capacitor is inversely proportional to the distance between electrodes facing each other and is proportional to the size of the electrodes. Thus, a total capacitance of the first reduction capacitors DC1 formed in the first transistor T1 is greater than that of the second reduction capacitors formed in the third transistor T3.

The third connection electrode CNE3 and a fourth connection electrode CNE4 are electrically connected to a second bridge electrode BE2 through second contact holes H2. A cross-sectional structure of the third and fourth connection electrodes CNE3 and CNE4 is substantially the same as that of the first and second connection electrodes CNE1 and CNE2. Thus, detailed descriptions of the cross-sectional structure of the third and fourth connection electrodes CNE3 and CNE4 will be omitted to avoid repetition.

The fourth connection electrode CNE4 may be extended to be connected to the drain electrode of the fourth transistor t4.

The third gate electrode GE3 of the third transistor T3 is extended and connected to a first branch electrode BCE1. The third drain electrode DE3 of the third transistor T3 is extended and connected to a second branch electrode BCE2.

The first branch electrode BCE1 is electrically connected to the second branch electrode BCE2 through third contact holes H3. As shown in FIG. 8, the first branch electrode BCE1 is disposed on the first base substrate 111. The first branch electrode BCE1 is foamed on the same layer as the third gate electrode GE3.

The first insulating layer 112 is disposed on the first base substrate 111 to cover the first branch electrode BCE1. The third contact holes H3 are formed penetrating through the first insulating layer 112 to expose a predetermined area of the first branch electrode BCE1. The second branch electrode BCE2 is disposed on the first insulating layer 112 and electrically connected to the first branch electrode BCE1 through the third contact holes H3.

The vertical start signal STV provided through the first control line SL1 is output through the dummy output terminal D_OUT via the first gate electrode GE1 of the first transistor T1 and the third gate electrode GE3 of the third transistor T3.

Static electricity may enter to the first control line SL1 from the external source. The static electricity entering through the first control line SL1 may be dispersed by the first reduction capacitors DC1 of the first transistor T1. Thus, the static electricity entering through the first control line SL1 may be reduced by the first reduction capacitors DC1 of the first transistor T1.

The first gate electrode GE1 is connected to the third gate electrode GE3. Therefore, the static electricity entering through the first control line SL1 may be further dispersed by the second reduction capacitors of the third transistor T3. Thus, the static electricity entering through the first control line SL1 may be further reduced by the second reduction capacitors of the third transistor T3.

The first control line SL1 may be connected to the third gate electrode GE3 without being connected to the first gate electrode GE1. In this case, the static electricity may be dispersed by the second reduction capacitors with the total capacitance smaller than that of the first reduction capacitors DC1. Thus, in the case that the first control line SL1 is connected only to the third gate electrode GE3 without being connected to the first gate electrode GE1, the reduction of the static electricity may decrease.

In one embodiment, the first control line SL1 is connected to the first gate electrode GE1 of the first transistor T1 and the third gate electrode GE3 of the third transistor T3. Also, the total capacitance of the first reduction capacitors DC1 of the first transistor T1 may be greater than that of the second reduction capacitors of the third transistor T3 in this embodiment. Thus, the static electricity entering through the first control line SL1 may be significantly reduced by the first reduction capacitor DC1 and additionally reduced by the second reduction capacitors.

The static electricity entering from the external source may be reduced by the first reduction capacitors DC1 of the first transistor T1 of the dummy stage DUM and the second reduction capacitors of the third transistor T3 of the dummy stage DUM. As a result, the first stage SRC1 and the (n+1)th stage may be prevented from being damaged even if the static electricity enters from the external source. Consequently, the gate driver 200 and the display apparatus 500 having the gate driver 200 may improve the resistance thereof to the static electricity.

Figure 9:
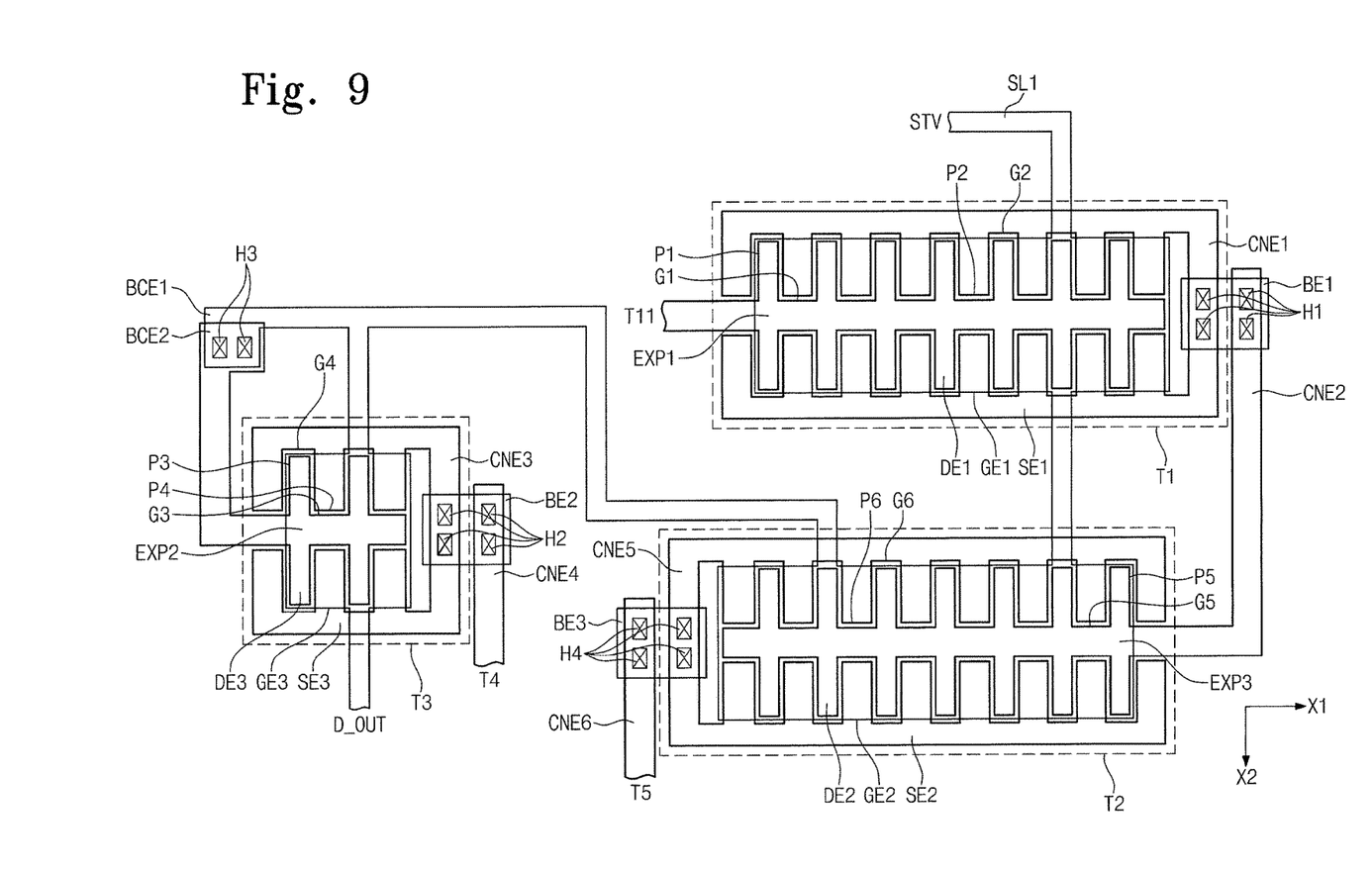
FIG. 9 illustrates first, second, and third transistors of a dummy stage of a gate driver according to another embodiment.

FIG. 9 illustrates an embodiment of first, second, and third transistors of a dummy stage of a gate driver.

A gate driver according to this embodiment may have the same structure and function as those of the gate driver shown in FIG. 5 except for the connection structure of first, second, and third transistors shown in FIG. 9. Thus, the following descriptions will be focused on the difference in the connection structure from that of the first and third transistors T1 and T3 shown in FIG. 5.

Hereinafter, the gate electrode, the drain electrode, and the source electrode of the second transistor T2 will be referred to as a second gate electrode GE2, a second drain electrode DE2, and a second source electrode SE2.

Referring to FIG. 9, a size of each of the first and second transistors T1 and T2 is greater than that of the third transistor T3 when viewed in a plan view. A structure of the first and third transistors T1 and T3 is substantially the same as that of the first and third transistors T1 and T3 of FIG. 5.

The first control line SL1 is connected to the first gate electrode GE1 of the first transistor T1, and the first gate electrode GE1 is extended and connected to the second gate electrode GE2 of the second transistor T2. The second gate electrode GE2 is extended and connected to the third gate electrode GE3 of the third transistor T3. The third gate electrode GE3 is extended and connected to the dummy output terminal D_OUT, and the dummy output terminal D_OUT is connected to the second control line SL2. Thus, the first control line SL1 is electrically connected to the second control line SL2 via the first, second, and third transistors T1, T2, and T3.

The second drain electrode DE2 of the second transistor T2 includes a third extension portion EXP3 extended in the first direction X1, a plurality of fifth protrusion portions P5 extended from the third extension portion EXP3 in the second direction X2 and extended in the opposite direction to the second direction X2, and fifth grooves G5 disposed between the fifth protrusion portions P5. The second drain electrode DE2 is extended and connected to the second connection electrode CNE2.

The second source electrode SE2 of the second transistor T2 includes sixth protrusion portions P6 extended in the second direction X2 and extended in the opposite direction to the second direction X2 to face each other, and sixth grooves G6 disposed between the sixth protrusion portions P6. The sixth protrusion portions P6 disposed at a leftmost position are connected to each other to form a fifth connection electrode CNE5.

The fifth protrusion portions P5 are alternately arranged with the sixth protrusion portions P6. Thus, the fifth protrusion portions P5 are disposed adjacent to the sixth grooves G6, and the sixth protrusion portions P6 are disposed adjacent to the fifth grooves G5.

When viewed in a plan view, the second gate electrode SE2 of the second transistor T2 is overlapped with the fifth protrusion portions P5, the third extension portion EXP3, and the sixth protrusion portions P6 except for the sixth protrusion portion P6 disposed at a rightmost position.

The fifth connection electrode CNE5 and a sixth connection electrode CNE6 are electrically connected to a third bridge electrode BE3 through fourth contact holes H4. Since a cross-sectional structure of each of the fifth and sixth connection electrodes CNE5 and CNE6 is substantially the same as that of the first and second connection electrodes CNE1 and CNE2 shown in FIG. 7, detailed descriptions on the cross-sectional structure of the fifth and sixth connection electrodes CNE5 and CNE6 will be omitted. The sixth connection electrode CNE6 may be extended and connected to the source electrode of the fifth transistor T5.

A cross-sectional structure of the second transistor T2 is substantially the same as that of the first transistor T1. Thus, third reduction capacitors may be disposed between the second gate electrode GE2 and the second drain electrode DE2 and between the second gate electrode GE2 and the second source electrode SE2.

When viewed in a plan view, a size of the second transistor T2 is greater than that of the third transistor T3. Thus, the number of the fifth and sixth protrusion portions P5 and P6 of the second transistor T2 is greater than the number of the third and fourth protrusion portions P3 and P4 of the third transistor T3. In addition, a size of the second gate electrode GE2 of the second transistor T2 is greater than that of the third gate electrode GE3 of the third transistor T3 in a plan view. Thus, the number of the third reduction capacitors of the second transistor T2 is greater than the number of the second reduction capacitors of the third transistor T3. As a result, a total capacitance of the third reduction capacitors of the second transistor T2 is greater than a total capacitance of the second reduction capacitors of the third transistor T3.

The vertical start signal STV provided through the first control line SL1 is output from the dummy output terminal D_OUT via the first gate electrode GE1 of the first transistor T1, the second gate electrode GE2 of the second transistor T2, and the third gate electrode GE3 of the third transistor T3.

Static electricity may enter to the first control line SL1 from the external source. The static electricity entering through the first control line SL1 may be dispersed by the first reduction capacitors DC1 disposed on the first transistor T1. The first gate electrode GE1 is connected to the second gate electrode GE2. Thus, the static electricity entering through the first control line SL1 may be dispersed by the third reduction capacitors of the second transistor T2. The second gate electrode GE2 is connected to the third gate electrode GE3. Therefore, the static electricity entering through the first control line SL1 may be dispersed by the second reduction capacitors disposed in the third transistor T3.

A total capacitance of the first reduction capacitors DC1 and a total capacitance of the third reduction capacitors are greater than that of the second reduction capacitors. Therefore, the static electricity entering through the first control line SL1 may be significantly reduced by the first reduction capacitors of the first transistor T1 and by the third reduction capacitors of the second transistor T2 and additionally reduced by the second reduction capacitors of the third transistor T3.

The static electricity entering from the external source may be reduced by the first reduction capacitors DC1 of the first transistor T1, the second reduction capacitors of the third transistor T3, and the third reduction capacitors of the second transistor T2. As a result, the first stage SRC1 and the (n+1)th stage SRCn+1 may be prevented from being damaged even though the static electricity enters from the external source. Consequently, the gate driver and the display apparatus having the gate driver according to one or more embodiments may improve the resistance thereof to the static electricity.

By way of summation and review, gate control signals used to drive a gate driver may be applied to the gate driver through a line part, and the gate driver may generate gate signals in response to the gate control signals. However, an external static electricity, caused by, e.g., friction, may enter the line part, and the static electricity may pass to the gate driver to damage the gate driver.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A gate driver for supplying a plurality of gate signals to a plurality of pixels, the gate driver comprising:
   a first signal line that receives a first start signal;
   a dummy stage having an input terminal and an output terminal, the input terminal to receive the first start signal through the first signal line, the output terminal to output a second start signal, the dummy stage including a plurality of transistors;
   a plurality of interconnected stages that sequentially output the plurality of gate signals in response to control signals and the second start signal output from the dummy stage; and
   a second signal line that applies the second start signal output from the dummy stage to a first stage and a last stage of the plurality of interconnected stages, the first signal line being connected to the second signal line via the plurality of transistors, wherein
   a circuit of the dummy stage is different from a circuit of each of the plurality of interconnected stages, wherein
   the plurality of transistors of the circuit of the dummy stage includes:
   a first transistor including two electrodes forming a first capacitor to store static electricity received through the input terminal, at least one of the two electrodes coupled to the first signal line;
   a second transistor being coupled to the first transistor and including two electrodes forming a second capacitor to store the static electricity received through the input terminal; and
   a third transistor coupled between the input terminal and the output terminal of the dummy stage, and wherein the third transistor has a size smaller than a size of each of the first transistor and the second transistor.

2. The gate driver as claimed in claim 1, wherein the first transistor includes:
   a first gate electrode;
   a first insulating layer disposed on the first gate electrode; and
   a first drain electrode and a first source electrode, which are disposed on the first insulating layer to be spaced apart from each other and overlapped with the first gate electrode,
   wherein the first capacitor includes first reduction capacitors being formed between the first gate electrode and the first drain electrode and between the first gate electrode and the first source electrode.

3. The gate driver as claimed in claim 2, wherein the third transistor includes:
   a third gate electrode disposed under and covered by the first insulating layer; and
   a third drain electrode and a third source electrode, which are disposed on the first insulating layer to be spaced apart from each other and overlapped with the third gate electrode, wherein third reduction capacitors are formed between the third gate electrode and the third drain electrode and between the third gate electrode and the third source electrode, wherein a total capacitance of the first reduction capacitors is greater than a total capacitance of the third reduction capacitors.

4. The gate driver as claimed in claim 3, wherein:
the first signal line is connected to the first gate electrode,
the first gate electrode extends to connect to the third gate electrode, and
the third gate electrode extends to connect to the second signal line.

5. The gate driver as claimed in claim 3, wherein the second transistor includes:
a second gate electrode disposed under and covered by the first insulating layer; and
a second drain electrode and a second source electrode, which are disposed on the first insulating layer to be spaced apart from each other and overlapped with the second gate electrode,
wherein the second capacitor includes second reduction capacitors formed between the second gate electrode and the second drain electrode and between the second gate electrode and the second source electrode, wherein each of a total capacitance of the first reduction capacitors and a total capacitance of the second reduction capacitors is greater than a total capacitance of the third reduction capacitors.

6. The gate driver as claimed in claim 5, wherein:
the first signal line is connected to the first gate electrode,
the first gate electrode extends to connect to the second gate electrode,
the second gate electrode extends to connect to the third gate electrode, and
the third gate electrode extends to connect to the second signal line.

7. A display apparatus, comprising:
a display panel that receives data voltages in response to gate signals and includes a plurality of pixels displaying gray-scales corresponding to the data voltages;
a gate driver that applies the gate signals to the pixels; and
a data driver that applies the data voltages to the pixels, the gate driver including:
a first signal line that receives a first start signal;
a dummy stage having an input terminal and an output terminal. the input terminal to receive the first start signal through the first signal line , the output terminal to output a second start signal, the dummy stage including a plurality of transistors;
a plurality of interconnected stages that sequentially output the gate signals in response to control signals and the second start signal output from the dummy stage; and
a second signal line that applies the second start signal output from the dummy stage to a first stage and a last stage of the plurality of interconnected stages, the first signal line being connected to the second signal line via the plurality of transistors, wherein
a circuit of the dummy stage is different from a circuit of each of the plurality of interconnected stages, wherein the plurality of transistors of the dummy stage includes:
a first transistor including two electrodes forming a first capacitor to store static electricity received through the input terminal, at least one of the two electrodes coupled to the first signal line;
a second transistor being coupled to the first transistor and including two electrodes forming a second capacitor to store the static electricity received through the input terminal; and
a third transistor coupled between the input terminal and the output terminal of the dummy stage, and wherein the third transistor has a size smaller than a size of each of the first transistor and the second transistor.

8. The display apparatus as claimed in claim 7, wherein the first transistor includes:
a first gate electrode;
a first insulating layer disposed on the first gate electrode; and
a first drain electrode and a first source electrode, which are disposed on the first insulating layer to be spaced apart from each other and overlapped with the first gate electrode,
wherein the first capacitor includes first reduction capacitors being formed between the first gate electrode and the first drain electrode and between the first gate electrode and the first source electrode.

9. The display apparatus as claimed in claim 8, wherein the third transistor includes:
a third gate electrode disposed under and covered by the first insulating layer; and
a third drain electrode and a third source electrode, which are disposed on the first insulating layer to be spaced apart from each other and overlapped with the third gate electrode,
wherein third reduction capacitors are formed between the third gate electrode and the third drain electrode and between the third gate electrode and the third source electrode, wherein a total capacitance of the first reduction capacitors is greater than a total capacitance of the third reduction capacitors.

10. The display apparatus as claimed in claim 9, wherein:
the first signal line is connected to the first gate electrode,
the first gate electrode extends to connect to the third gate electrode, and
the third gate electrode extends to connect to the second signal line.

11. The display apparatus as claimed in claim 9, wherein the second transistor includes:
a second gate electrode disposed under and covered by the first insulating layer; and
a second drain electrode and a second source electrode, which are disposed on the first insulating layer to be spaced apart from each other and overlapped with the second gate electrode,
wherein the second capacitor includes second reduction capacitors being formed between the second gate electrode and the second drain electrode and between the second gate electrode and the second source electrode, wherein each of a total capacitance of the first reduction capacitors and a total capacitance of the second reduction capacitors is greater than a total capacitance of the third reduction capacitors.

12. The display apparatus as claimed in claim 11, wherein:
the first signal line is connected to the first gate electrode,
the first gate electrode extends to connect to the second gate electrode,
the second gate electrode extends to connect to the third gate electrode, and
the third gate electrode extends to connect to the second signal line.

* * * * *